United States Patent [19]

Yamaguchi et al.

[11] Patent Number: 4,609,809

[45] Date of Patent: Sep. 2, 1986

[54] METHOD AND APPARATUS FOR CORRECTING DELICATE WIRING OF IC DEVICE

[75] Inventors: Hiroshi Yamaguchi, Fujisawa; Akira Shimase, Yokohama; Tateoki Miyauchi, Yokoha; Mikio Hongo, Yokohama, all of Japan

[73] Assignee: Hitachi, Ltd., Tokyo, Japan

[21] Appl. No.: 590,344

[22] Filed: Mar. 16, 1984

[30] Foreign Application Priority Data

Mar. 16, 1983 [JP] Japan .................................. 58-42126

[51] Int. Cl.$^4$ ............................................. B23K 15/00
[52] U.S. Cl. ..................... 219/121 EM; 219/121 EK; 219/121 EJ; 204/192.34
[58] Field of Search ................... 219/121 EJ, 121 EH, 219/121 EK, 121 EM; 204/192 E

[56] References Cited

U.S. PATENT DOCUMENTS

| | | | |
|---|---|---|---|
| 2,699,334 | 10/1972 | Cohen et al. | 219/121 EJ |
| 3,162,767 | 12/1964 | Di Curcio et al. | 219/121 EJ |
| 4,190,759 | 2/1980 | Hongo | 219/121 LM |
| 4,259,367 | 3/1981 | Dougherty, Jr. | 219/121 LK |
| 4,419,203 | 12/1983 | Harper et al. | 204/192 E X |
| 4,457,803 | 7/1984 | Takigawa | 204/192 E |

Primary Examiner—Philip H. Leung
Attorney, Agent, or Firm—Antonelli, Terry & Wands

[57] ABSTRACT

The invention discloses a method and apparatus for correcting a device characterized in that an ion beam is extracted from an ion source having high luminance such as a liquid metal ion source or the like, the ion beam is then converged to a delicate spot by use of a charged particle optical system and apertures, a wiring portion formed on and outside of an active layer region of a device and connected to the device is located to the spot by observing the wiring portion through an SIM, the ion beam in neutralized by an electron shower so as to prevent the wiring portion from being charged electrically, the converged ion beam spot is radiated to the wiring portion to remove the wiring portion, and radiation of the ion beam is stopped while observing the ion beam by a second ion mass spectrometer which detects that the wiring portion is cut by the ion beam and the ion beam reaches an insulating layer.

21 Claims, 33 Drawing Figures

METHOD AND APPARATUS FOR CORRECTING DELICATE WIRING OF IC DEVICE

BACKGROUND OF THE INVENTION

This invention relates to a method and apparatus for correcting a delicate wiring pattern of a highly integrated device.

The pattern width and wiring width have become smaller and smaller recently in devices such as a semiconductor integrated circuit, a GaAs device, a magnetic bubble memory, a Josephson device, and the like. Devices which are from $3\mu$ to $2\mu$ wide have been realized, and IC devices having wiring widths of $1.5\mu$, $1\mu$ and sub-microns are now under development. It has been a customary practice to cut the wiring of these IC devices for debugging at the device developing stage, and to cut and connect part of the devices at the fabrication stage of the devices for the relief of defective portion(s), read, adjustment of resistance and capacitance, and so forth.

Cutting of an Al wiring for debugging will now be described as a typical example, but the following can be obviously applied to the wirings made of Au, polysilicon, and the like, too.

In the design and developing process of semiconductor integrated circuits (hereinafter referred to as "ICs"), chips that are produced on a trial basis do not mostly operate as such due to the design and/or process defects. To determine the defective portion(s) of the device, it is necessary in this case to cut a peripheral wiring and to carry out an operation test. However, a passivation film is disposed from time to time on the wiring depending upon the kind of IC devices. If a pattern is greater than $5\mu$, the wiring is removed by scratching it off by a thin metal needle fitted to a manipulator, while the device is being observed by a microscope. However, since this method requires a high skill but provides only a low success ratio, it can not be used for IC devices whose pattern is $3\mu$ or below.

FIG. 1 of the accompanying drawings illustrates an apparatus for cutting the wiring of an IC device by means of a laser, as disclosed in U.S. Pat. No. 4,190,759, for example. A laser beam 1a emitted from a laaser oscillator 1 is reflected by a mirror 2, and the beam diameter is expanded by a beam expander 3 consisting of a combination of lenses 3a and 3b. A reduction projection image of a rectangular pattern whose size is controlled by variable slits 5 and 6 is formed by a lens 7 on a specimen 8 placed on a table 9. In this case, the light from a lamp 2a for the reference light is reflected by a concave mirror 2b, and is then turned into parallel beams by a lens 2c and the image of the beams is formed on the wiring after passing through the same route as the laser beam. Accordingly, locating of the portion to be removed by the laser, and the like, becomes possible.

In other words, in FIG. 3(a), the Al wiring portion 11 is adjacent to the portion 10 devoid of the wiring. Its section is such as shown in FIG. 2 if a passivation film is not formed. An Al wiring 15 is formed on an Si substrate 13 via an $SiO_2$ insulating layer 14. In FIG. 1, the image 12 of the slits 5, 6 by the reference light 2d is projected, and the width of the slits is adjusted using micrometers 5, 6 to the width of the wiring portion 11 to be cut. When the laser light is then radiated, the laser light forms the image at exactly the same position 12, and this portion is removed. However, the following problem occurs in this case.

The portion fused by the laser scatters to the peripheral portion and is deposited to the latter, reducing the characteristics of the IC device and causing a short-circuit. Although the $SiO_2$ insulating layer 14 below the Al wiring 15 is transparent to the laser light, the Si substrate 13 absorbs it. Moreover, the absorbancy of the laser light by the Si is greater than that of the Al. When the Al wiring is to be cut by the laser, the Si substrate below the Al wiring is damaged as shown in FIG. 3(c), and since part of Si is fused and swells, it causes a short-circuit with the Al wiring. The laser also affects adversely the portion which is devoid of the Al wiring and is adjacent thereto, sideways of the Al wiring, causing damage of the Si below the Al wiring. In addition, a short-circuit between the Al and Si is likely to occur in the same way as described above. This is mainly because locating the laser radiation range is difficult, and part of the laser light is radiated to the portion 10 devoid of the Al wiring, and since the insulating layer 14 is transparent to the laser light, it damages a p-type Si portion having conductivity, for example, which is adjacent to the Al wiring, due to thermal conduction and scattering of the Al.

Particularly when a passivation film 18 is coated on the Al wiring 15 as shown in FIG. 4, the Al wiring 15 below the passivation film 18 absorbs the laser light, receives the thermal energy and breaks and projects out of the passivation film because the passivation film 18 is generally made of $SiO_2$, $Si_2N_4$ or the like, is transparent to the laser light and is not therefore worked directly by the laser. For this reason, the scattering Al particles have by far higher energy than when the passiviation film is not provided, are likely to damage the lower and peripheral portions as depicted in FIG. 3(c) and cause cracks on the passivation film itself. Furthermore, the cutting portion involves the possibility that a hole 20 is bored on the passivation film to cause a short-circuit. Since there is no effective method which can easily bury the hole, the device characteristics are likely to drop.

A more fundamental problem is that the method of cutting the wiring by the laser work can not cope with the technical trend that miniaturization and higher density integration of IC devices are contemplated further and the wiring width becomes narrower and narrower from $2\mu$ to $1.5\mu$ and $1\mu$, and further down to the submicron order. In other words, it is difficult to obtain a wavelength ($0.5\mu$ in terms of visible light) spot diameter due to the diffraction limit of the laser light in either of the cases where the image formation projection method shown in FIG. 1 is used and where the beam is thinly contracted by the lens 21 and the specimen is positioned at the focal point, as shown in FIG. 5. Furthermore, the laser work process must pass through the process in which the material first absorbs the laser light and after it is changed to the heat, it scatters the material. Accordingly, influences upon the peripheral portions are unavoidable due to thermal conduction, fusing and jetting, and the like. Thus, the work zone and the zone affected by the heat become inevitably greater than the spot diameter. In other words, the minimum work size of the practical level is about $1\mu$ and for this reason, it has been difficult to apply the laser work method of a wiring pattern of below $1\mu$.

SUMMARY OF THE INVENTION

It is therefore an object of the present invention to provide a method and apparatus for cutting a wiring of an IC device which eliminates the cutting method of the wiring of IC devices in accordance with the conventional laser work described above, and which makes it possible to cut the wiring of IC devices without causing damage of peripheral devices and without affecting them adversely.

The present invention is characterized in that an ion beam from a high luminance ion source, such as a liquid metal ion source or a ultra-low temperature electrolytic dissociation type ion source, is converged by an ion beam optical system such as electrostatic lenses, and is radiated to a wiring portion of an IC outside an active layer region of the IC so as to cut the wiring portion by a sputtering work. Particularly because the work process in the present invention is the sputtering work utilizing the collision and scatter of the ions and a target atom, adverse influences upon the peripheral devices hardly occur, and the wiring of the IC can be cut without any problem. Especially because the boundary between the wiring and an oxide film as the base below the wiring is detected by a second ion mass spectrometer, the work is prevented from reaching the Si substrate. The present invention makes it also possible to remove a passivation film and to cut the wiring by the ion beam even if the wiring has the passivation film thereon. If micro-deposition using a focused ion beam is used conjointly, the hole portion of the passivation film after cutting of the wiring can be buried. Since the present invention is an ion beam work method, a spot diameter of 0.3 to 1.0 μm or below can be obtained, and the invention can be sufficiently applied to the miniaturization of the wiring pattern of an IC device.

DESCRIPTION OF THE PREFERRED EMBODIMENTS

Hereinafter, a method of cutting the wiring of an IC device in accordance with the present invention will be described with reference to the accompanying drawings.

Figure 6:
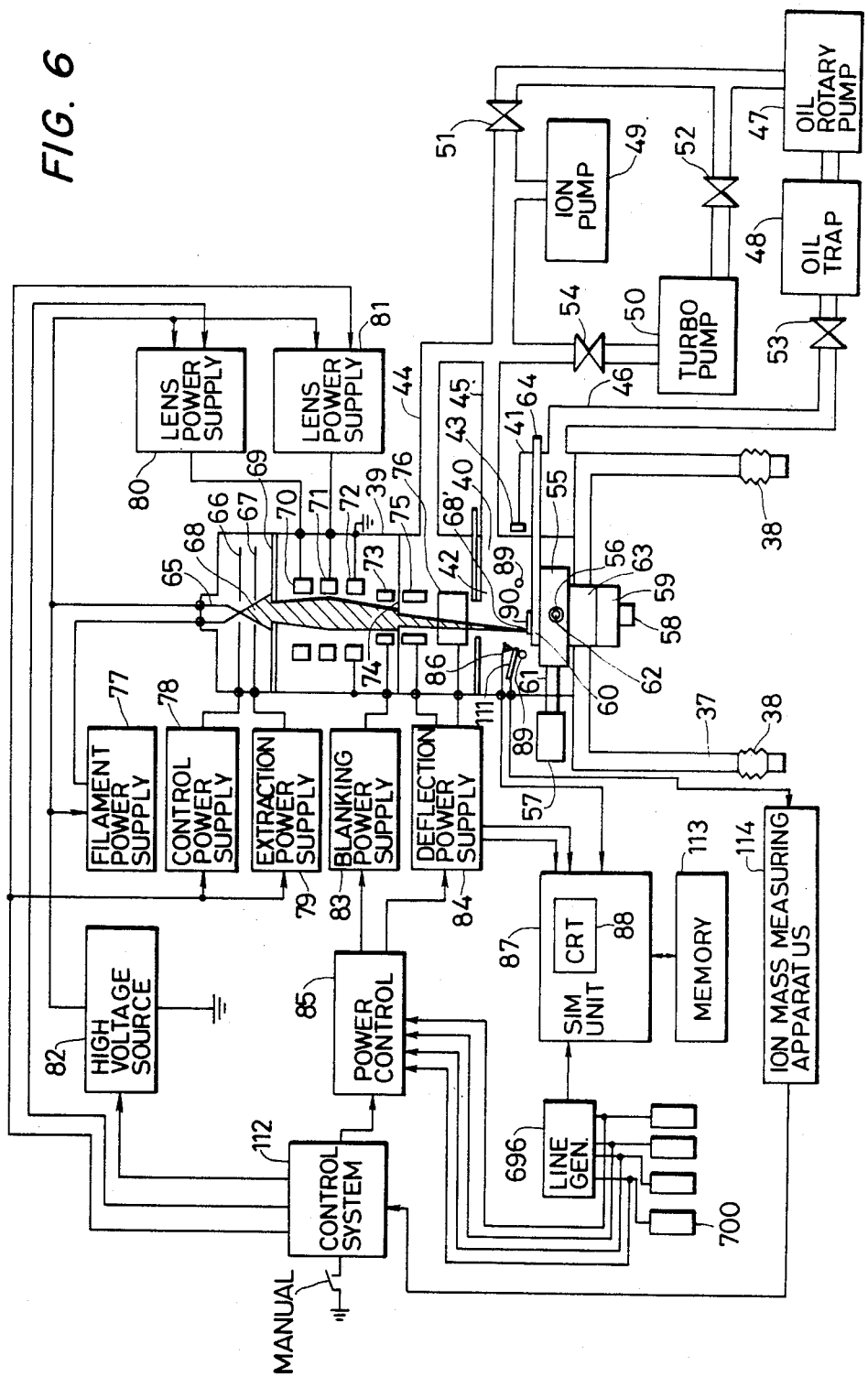
FIG. 6 is a schematic view showing an apparatus for cutting a wiring by an ion beam in accordance with the present invention.

FIG. 6 shows an apparatus for cutting the wiring of an IC device in accordance with one embodiment of the present invention.

The arrangement of FIG. 6 includes a bed 37, a column 39 and a specimen chamber 40, both constituting a vacuum container, a specimen exchanging chamber 41 provided adjacent to the specimen chamber 40, a pumping system 47–54, a table 55 for mounting an IC device, a liquid-metal ion source (a high luminance ion source) 65, a control (bias) generating electrode 66, an ion beam extracting electrode 67, an aperture (circular opening) 69, electrostatic lenses 70, 71 and 72, a blanking electrode 73, an aperture (rectangular opening) and micrometer 74, a pair of deflection electrodes 75 and 76, a filament power supply 77, a control electrode power supply 78, an extracting electrode power supply 79, electrostatic lens power supplies 80 and 81, a high voltage power supply 82, a blanking electrode power supply 83, a deflection electrode power supply 84, a power supply controller 85, a secondary charged-particle detector 86 inserted in the specimen chamber 40, a scanning ion microscope (SIM) observation unit 87, and a means 89 for preventing the spot disturbance caused by charges of the ion beam.

The bed 37 is proof against dusts by provision of air support 38. The specimen chamber 40 and specimen exchange chamber 41 are located over the bed 37, and the mirror tube 39 is located over the specimen chamber 40. The specimen chamber 40 is separated from the column 39 and the specimen exchange chamber 41 by gate valves 42 and 43, respectively.

The pumping system is arranged including an oil rotary pump 47, an oil trap 48, an ion pump 49, a turbo molecular pump 50, and valves 51, 52, 53 and 54. The pumping system is connected to the column 39, the specimen chamber 40 and the specimen exchange chamber 41 through pipes 44, 45 and 46, respectively, so that the mirror tube 39, specimen chamber 40 and specimen exchange chamber 41 are evacuated to the extent of $10^{-5}$ torr or less.

The table 55 is provided with feed micrometers 56, 57 and 58 for the X, Y and Z directions through rotary feedthroughs 61, 62 and 63, operated manually, respectively, and further provided with a travelling ring 59 for the $\theta$ direction, so that the table 55 can be moved finely in the X, Y and Z directions and around the vertical axis.

On the table 55, there is disposed a specimen tray 60 on which an IC-device is placed. The specimen tray 60 can be moved between the specimen chamber 40 and the specimen exchange chamber 41 by a specimen drawing (taking) bar 64. When the IC device is replaced, the gate valve 43 is opened, the specimen tray 60 is taken out into the specimen exchange chamber 41 from the specimen chamber 40, the gate valve 43 is closed, the door of the specimen exchange chamber 41 is opened, the IC devices are changed, the door is closed, the specimen exchange chamber 41 is evacuated preliminarily, the gate valve 43 is opened, and then the specimen tray 60 is placed within the specimen chamber 40. In FIG. 6, the IC device is shown by a reference numeral 90.

Figure 7:
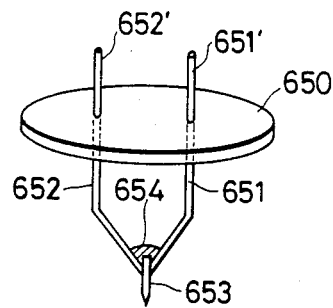
FIG. 7 is a schematic view showing a liquid metal ion source.

The liquid metal ion source 65 shown in detail in Vac. Sci. Technol., Vol. 16, No. 6, November/December 1979, Page 1871–1879, is located at the top of the column 39 so that it confronts the specimen chamber 40. The liquid metal ion source 65 shown in FIG. 7 includes an insulating base 650, filaments 651 and 652 assembled in V-shape on the base 650, an acute needle 653 made of tungsten or the like and spot-welded between the tips of the filaments 651 and 652, and a metal piece 654 attached on the needle 653 so as to serve as an ion source. For the ion source metal 654, Ga, In, Au, Bi, Sn, or Cu is used. The filaments 651 and 652 are connected through terminals 651' and 652' to the filament power supply 77 which is connected to the high voltage power supply 82.

The control electrode 66 is located below the liquid metal ion source 65 and connected electrically to the control electrode power supply 78 which is connected to the high voltage power supply 82. A low positive or negative voltage is applied to the control electrode 66 so as to control the ion beam current.

The ion beam extraction electrode 67 is located below the control electrode 66 and connected electrically to the extraction electrode power supply 79 which is connected to the high voltage power power 82. With a current supplied to the filaments 651 and 652 of the liquid metal ion source 65 so as to melt the metal in the vacuum of $10^{-5}$ torr or less, and with a negative voltage of several kV to several deca-kV applied to the extraction electrode 67, an ion beam is drawn out of a very narrow area at the tip of the needle 653 in the liquid metal ion source 65. In FIG. 6, the ion beam is shown by a reference numeral 68 and its spot is shown by 68'.

The circular aperture 69 is located below the extraction electrode 67, and serves to pass only the central portion of the ion beam which has been extracted by the extraction electrode 67.

The electrostatic lenses 70, 71 and 72 are aligned below the aperture 69 and connected electrically to the lens power supplies 80 and 81 which are connected to the high voltage power supply 82. These lenses 70, 71 and 72 serve to focus the ion beam which is fed through the aperture 69.

The blanking electrode 73 is located below the electrostatic lens 72 and connected electrically to the blanking electrode power supply 83 which is connected to the controller 85. The blanking electrode 73 swings the ion beam very quickly so as to deflect the beam out of the rectangular aperture 74 located below the blanking electrode 73, so that projection of the ion beam to the IC device is interrupted quickly.

The pair of deflection electrodes 75 and 76 are located below the aperture 74 and connected electrically to the deflection electrode power supply 84 which is connected to the controller 85. The deflection electrodes 75 and 76 deflect the ion beam spot, which has been focused by the electrostatic lenses 70, 71 and 72 and has been passed further only the central portion of the ion beam by the aperture 74, in the X and Y directions so that the beam spot is positioned to a cutting position of a wiring on the IC device.

In other words, the ion beam emitted from the high luminance ion source is contracted twice by the apertures 69 and 74 described above, and is converged by the electrostatic lenses 70, 71 and 72. Accordingly, a spot diameter of 0.3 to 0.1 $\mu$m is obtained on the IC device 90, and the cutting work of a wiring below 1 $\mu$m of the IC device can be carried out.

The high voltage power supply 82 supplies a high voltage of several deca-kV to the filament power supply 77 for the liquid metal ion source 65, the control electrode power supply 78, the ion beam extraction electrode power supply 79, and the lens power supplies 80 and 81.

The controller 85 operates on the blanking electrode power supply 83 and the deflection electrode power supply 84 to operate the blanking electrode 73 and the deflection electrodes 75 and 76 in accordance with the specified scanning pattern.

The secondary charged-particle detector 86 is located within the specimen chamber 40 so that it confronts the IC device. The detector 86 catches secondary electrons or secondary ions emitted from the IC device as it is exposed to the ion beam, transduces the intensity of emission into a signal of electric current, and sends the signal to the SIM observation unit 87.

The SIM observation unit 87 receives from the deflection electrode power supply 84 signals representing the ion beam deflection in the X and Y directions and performs the scanning of its cathode ray tube (CRT) 88 in synchronization with the signals, and at the same time, varies the intensity of the CRT spot in accordance with the secondary emission signal provided by the secondary charged-particle detector 86, whereby the image of the IC device representing the amount of secondary electron emission at each point of the IC device is displayed. Owing to the function of the SIM (scanning ion microscope), the IC device surface can be observed on magnified scale.

Figure 8:
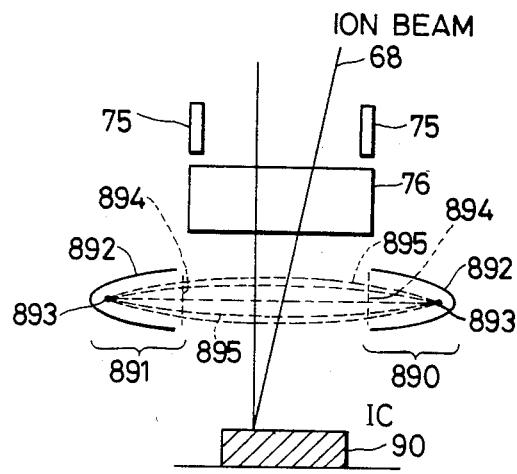
FIG. 8 is a schematic view useful for explaining a method of neutralizing the ion beam by an electron shower and a method of preventing the charge of the wiring.

There is disposed between the deflection electrode 76 and the specimen 90 a means 89 for preventing the spot disturbance caused by charges of the ion beam. The means 89 for preventing the spot disturbance as shown in FIG. 8 includes a pair of electron shower units 890 and 891 which confront with each other on the axis intersecting the ion beam path, and each of the electron shower units 890 and 891 is made up of a cup-shaped main body 892, a filament 893 provided within the body, and a grid-shaped extraction electrode 894 attached at the opening section of the body 892. The electron shower units 890 and 891 take out streams of electrons 895 from the filament 893 by an acceleration voltage of around 100 V applied to the extraction electrode 894, and release the electron streams 895 into the space where the ion beam goes through, thereby charging the ion beam negatively for neutralization.

Accordingly, when the ion beam is radiated to the wiring, the potential that occurs at that wiring portion rises above the withstand voltage of the IC device, and the break-down of the IC device can be prevented.

The inspection system for the specimen 90 is connected with control system 112, which is turn is connected to the high voltage power supply 82, the controller 85, and the lens power supplies 80 and 81. The control system 112 is arranged such that it switches the power supplies connected to the high voltage power supply 82 and the controller 85 to provide a small current and low acceleration voltage for producing an ion beam for a wide scanning area when the IC device 90 is observed or inspected for a wiring portion, and to provide a large current and high acceleration voltage for producing an ion beam for a narrow scanning area when the wiring of the IC device is cut.

In FIG. 8, reference numeral 68 represents the ion beam, reference numerals 75 and 76 are deflection electrodes and reference numeral 90 is the IC device.

Next, the operation of the apparatus for cutting the wiring of the embodiment described above will be described together with the method of cutting the wiring in accordance with the present invention with reference to FIGS. 6 through 9.

Before placing an IC device 90 in the specimen chamber 40, the entire vacuum container 39 is evacuated by a vacuum pump means. The specimen tray 60 is drawn out into the specimen exchange chamber 41 by means of the drawing bar 64 provided on the tray 60. The gate valve 43 is closed, the door of the specimen exchange chamber 41 is opened, and the IC device 90, i.e., an IC chip or wafer, is placed on the specimen tray 60. After preliminary evacuation for the specimen exchange chamber 41, the tray 60 is entered into the specimen chamber 40 and the tray 60 is placed at the specified position on the table 55. Subsequently, the pumping system is activated to evacuate the column 39 and the specimen chamber 40 to the extent of $10^{-6}$ torr. The X-axis and Y-axis micrometers 56 and 57 are operated manually to move the table 55 so that the inspection start position on the IC device 90 is set. The Z-axis fine feeding micrometer 58 and the $\theta$-axis rotating ring 59 are operated so that the IC device position is finely adjusted in the Z-axis direction and on the horizontal plane.

Incidentally, the tray 60 is grounded, and the electrode take-out portion of the IC device is grounded, whenever necessary.

Subsequently, the control system 112 is operated to switch the high voltage power supply 82, controller 85 and the lens power supplies 80 and 81 so that a small current and low acceleration voltage for producing an ion beam having a wide scanning range are supplied to the electrodes 77–81, 83 and 84. Then, observation and inspection for the wiring on the IC device 90 are started.

The filament in the liquid metal ion source 65 is heated by being supplied with a current from the power supply 77, and when a negative voltage of several kV to several deca-kV from the power supply 79 is applied to the extraction electrode 67, an ion beam 68 is extracted out of a very narrow area on the tip of the filament in the liquid metal ion source 65. At the same time, a low positive or negative voltage from the power supply 78 is applied through the control electrode 66 to the portion near the tip of the filament in the liquid metal ion source 65 to thereby control the ion beam current.

The high luminance ion beam 68 extracted from the liquid metal ion source 65 is passed through the circular aperture 69 so that only the central portion of the beam is extracted. Then the ion beam is focused to a spot 68' having a diameter of 0.1–0.5 $\mu$m or less on the IC device surface by means of the electrostatic lenses 70 and 71 with voltages from the power supplies 80 and 81 applied thereto and another electrostatic lens 72.

Furthermore, only the central portion of the ion beam is passed through the aperture 69. Particularly, the voltage of the electrostatic lens 71 is changed and adjusted while observing the SIM image to improve the image resolution, thereby providing a delicate converged spot (0.1–0.5 $\mu$m or less).

Then, the ion beam is deflected in the X and Y directions by the deflection electrodes 75 and 76 with a voltage from the power supply 84 applied thereto, and the ion beam is focused to a spot 68' having a diameter of 0.1–0.5 $\mu$m or less on the surface of the IC device 90. Therefore, the wiring of IC device having a diameter of 1 $\mu$m or less can be cut.

As mentioned previously, when the ion beam 68 is projected onto the surface of the IC device 90, secondary charged-particles are emitted from the IC device 90. The secondary charged-particles, i.e., secondary electrons or secondary ions, are caught by the secondary charged-particle detector 86, which then transduces the intensity of emission into an electric current and supplies the current to the SIM observation unit 87. The SIM observation unit 87 receives from the deflection electrode power supply 84 the signals indicating the amount of ion beam deflections in the X and Y directions, and swings the spot of the CRT (TV monitor display) in synchronization with the signals. At the same time, the intensity of the CRT spot is varied in accordance with the current signal from the secondary charged-particle detector 86, and the image of the IC device 90 is displayed.

Subsequently, the image signal of the IC device 90 obtained by the SIM observation unit 87 is converted to a binary signal by the binary circuit (not shown), and the binary signal is stored by the memory 113 in the inspection system for the IC device 90. The binary signal represents whether or not the wiring pattern exists on the IC device.

When designing and developing IC devices, the prototype chips do not operate as such from time to time due to the design defect and the process defect. In such a case, the operation test is conducted by cutting the Al wiring around the defective portion or by making that portion open or by applying a signal to that portion with a needle-like pin in order to find out the defective portion.

In other words, the operation test is conducted by manually turning the feed micrometers 56 and 57 and the θ-direction feed cylinder 59, which is provided outside the specimen chamber 40, through the rotary feedthroughs 61, 62, 63, so that the wiring portion around the defective portion of the IC is positioned to the CRT (TV monitor display) 88, that is, to the middle of the deflection electrodes 75 and 76. In order to cut the Al wiring portion, the control electrode 66 and the extraction electrode 67 are first operated so as to take out the ion beam 68 with a low acceleration voltage of several kV or less from the ion source metal 654 through the needle 653 of the liquid metal ion source 65. The spot 68' of the ion beam is manipulated to scan the surface of the specimen 90, and the surface of the IC device is displayed on a magnified scale on the CRT (TV monitor display) 88 of the SIM observation unit 87 in accordance with the deflection signal (saw tooth wave) from the deflection electrode power supply 84 and the signal from the secondary charged-particle detector 86.

Figure 10:
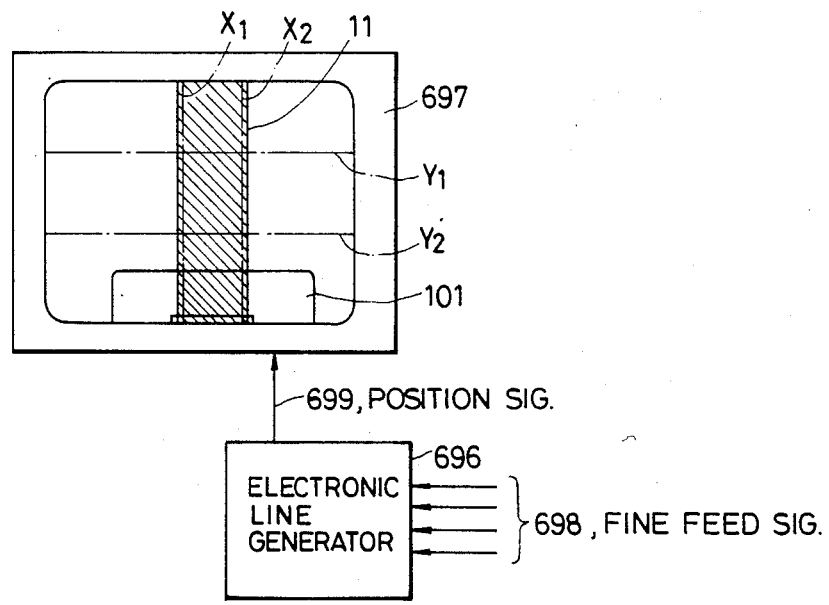
FIG. 10 is a plan and schematic view useful for explaining the method of locating the radiation region of the ion beam to the wiring portion by use of electronic lines.

As shown in FIG. 10, four electronic lines $X_1$, $X_2$, $Y_1$ and $Y_2$ are displayed on the screen of the TV monitor display 697 (88). The operator moves the displayed electronic lines by operating an electronic line generator 696 by application of signals 698 from potentiometers or the like, so that the Al wiring cutting portion (shown in FIG. 9A) is enclosed within a rectangle formed by the four electronic lines $X_1$, $X_2$, $Y_1$ and $Y_2$. In other words, it is necessary to bring the scanning width of the ion beam into agreement with the wiring width.

After the observation and inspection for the Al wiring portion of IC device 90, the blanking electrode 83 is operated so as to swing the ion beam 68 quickly out of the aperture 74, thereby halting the exposure of the specimen 90 to the ion beam 68 quickly.

Figure 9A:
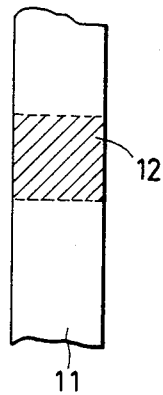
FIG. 9A is a schematic view showing the state in which the radiation region of the ion beam is located to the wiring portion.
Figure 9B:
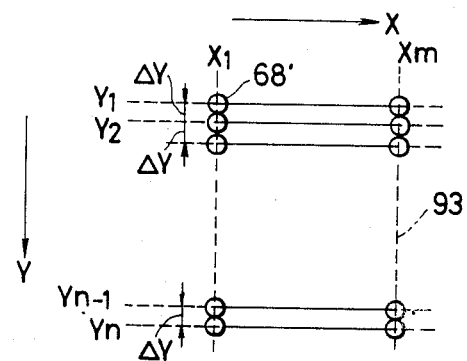
FIG. 9B is a schematic view showing the state in which the wiring is cut by scanning the ion beam.

Subsequently, a negative voltage of several deca-kV is applied to the ion beam extraction electrode 67 so as to extract an ion beam 68 out of a very narrow area of the tip of the needle 653 in the liquid metal ion source 65, and the ion beam current is controlled by application of a much lower positive or negative voltage to the control electrode 66. The ion beam 68 is entered through the aperture 69 to allow only the central portion of the beam to pass through, then the ion beam is focused by the electrostatic lenses 70, 71 and 72 and the aperture 74 and its spot 68' is projected to the Al wiring portion on the IC device 90 while being deflected in the X and Y directions by the deflection electrodes 75 and 76, whereby the Al wiring portion of IC device can be processed by sputtering. In correcting the black spot defect 92, the ion beam spot 68' on row $Y_1$ is swung in the X-axis direction, as shown in FIG. 9B, and in this case when the beam spot has come to $X_1$ on the X coordinate, the blanking electrode 73 is operated so that the ion beam reaches the specimen, and when the beam spot has come to $X_m$, the blanking electrode is operated so that the ion beam is deflected from the specimen. Then, the beam spot is shifted in the Y-direction by $\Delta Y$, and on the row of $Y=Y_2$ the ion beam is swung in the X-direction in the same manner. This operation is repeated until the row of $Y-Y_n$ has been scanned. Thus the area of $X_1 \leq X \leq X_n$ and $Y_1 \leq Y \leq Y_n$ is exposed to the ion beam, and defects are removed by the sputtering process.

In this way, the area of $X_1 \leq X \leq X_m$ and $Y_1 \leq Y \leq Y_n$ enclosed by the electronic lines $X_1$, $X_2$, $Y_1$ and $Y_2$ is exposed to the ion beam, and the defect is removed by the sputtering process.

Figure 11:
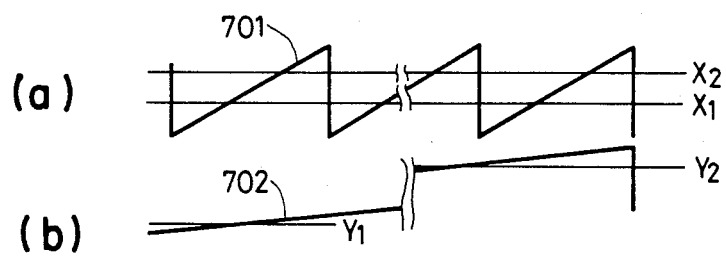
FIGS. 11(a) and 11(b) are diagrams showing signal waveforms to be applied to deflection electrodes, respectively.

The controller 85 supplies the blanking signal to the power supply 82 before and after voltage levels 701 and 702 of the saw tooth waves supplied to the deflection electrode power supply 84 become equal to voltage signals $V_{X1}$, $V_{X2}$, $V_{Y1}$ and $V_{Y2}$ obtained from potentiometers 700, as shown in FIGS. 11(a) and (b), so as to operate on the blanking electrode 73 to deflect the ion beam out of the aperture 74. In consequence, only the area enclosed by the electronic line is subjected to the sputtering process in the vacuum chamber.

Figure 12A:
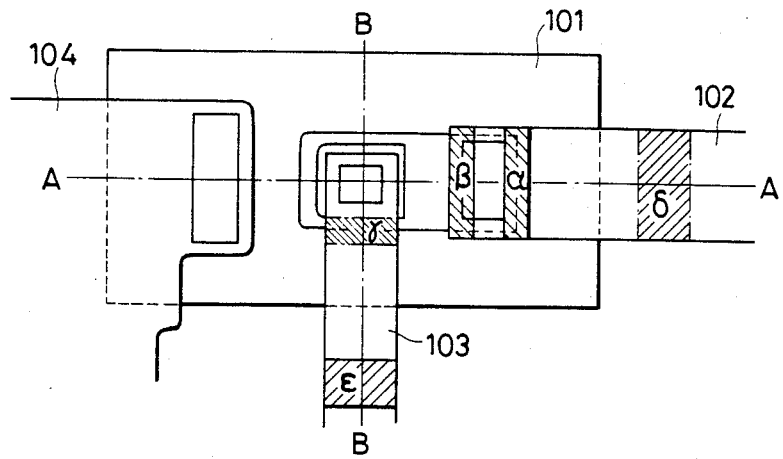
FIG. 12A is a plan view showing an NPN transistor as an example of the IC device whose wiring is to be cut.
Figure 12B:
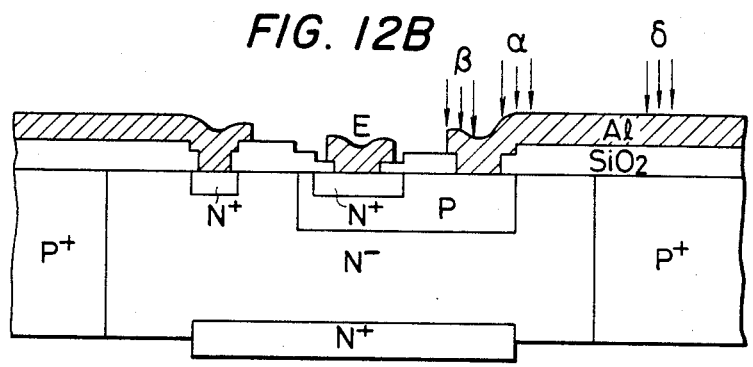
FIG. 12B is a sectional view taken along line A—A of FIG. 12A.
Figure 12C:
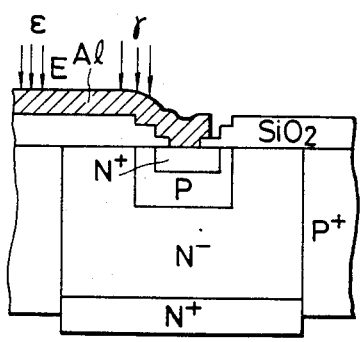
FIG. 12C is a sectional view taken along line B—B of FIG. 12A.

When the Al wiring around the defective portion of the IC is cut in the manner described above, a problem of a withstand voltage occurs if the potential charged to this wiring portion reaches some dozens of volts, because the wiring is connected to a device such as an NPN transistor as shown in FIG. 12A, FIG. 12B and FIG. 12C. However, when the wiring portion is cut by the ion beam as in the embodiment described above, the current of the micro-ion beam is as weak as about 1 nA, and the voltage rise due to the charge resulting from the radiation of the ion beam to the wiring is about 1 V to about 0.1 V, because the impedance is from about 1 GΩ to 100 MΩ. Accordingly, the device is not broken.

However, if the ion beam of Ga or the like is radiated to the active layers forming the device such as the α, β and γ portions shown in FIGS. 12A through 12C, it affects the layer P forming the connecting portion of the NPN transistor, the impurity concentration of N+, and so forth. Accordingly, cutting should be effected by radiating the ion beam to the δ and ε portions which are spaced apart from the active layer region 101 and has an SiO$_2$ insulating layer therebelow.

Figure 1:
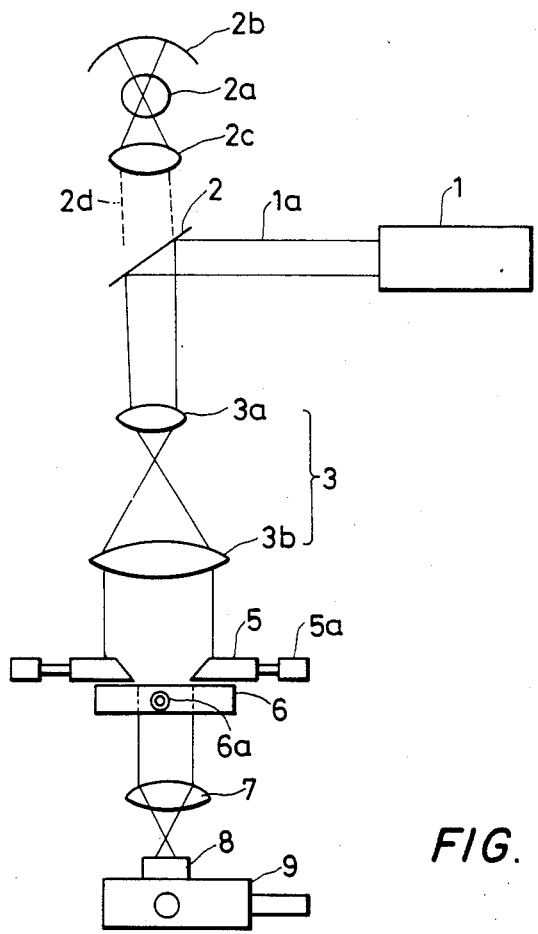
FIG. 1 is a schematic view showing an apparatus for cutting a wiring in accordance with the conventional laser work.
Figure 5:
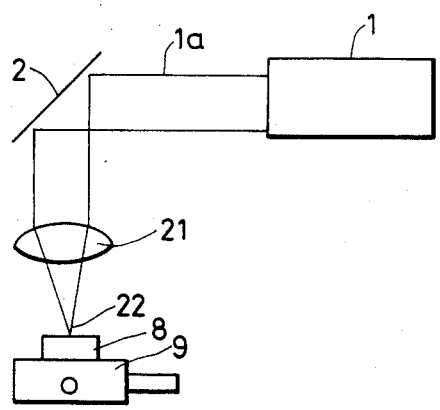
FIG. 5 is a block diagram showing another example of the apparatus for cutting the wiring in accordance with the conventional laser work.
Figure 2:
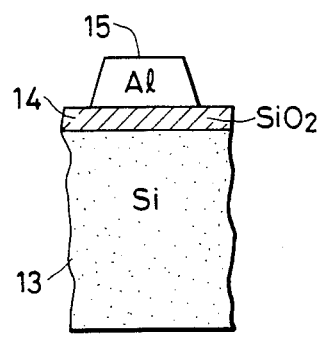
FIG. 2 is a sectional view showing the wiring portion of an IC device when a passivation film is not formed on the Al wiring.

When debugging is effected at the stage of design and development of an IC, there are a case in which debugging is effected after forming an about 0.3 μm-thick passivation film and a case in which it is effected before forming this passivation film or after peeling off the passivation film. If the passivation film is not formed as shown in FIG. 2, position registration becomes possible by observing the wiring itself by the SIM because the wiring is exposed to the surface.

Figure 4:
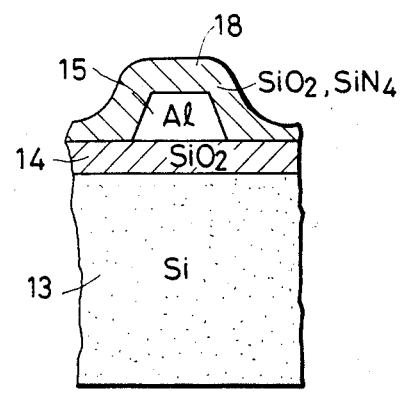
FIG. 4 is a sectional view showing the wiring portion of an IC device when a passivation film is formed on the Al wiring.
Figure 3A:
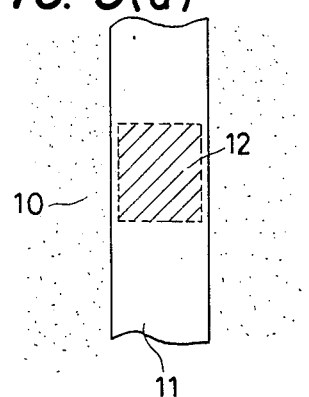
FIG. 3(a) is a plan view showing the state in which the laser light is radiated to the Al wiring portion shown in FIG. 2.
Figure 3B:
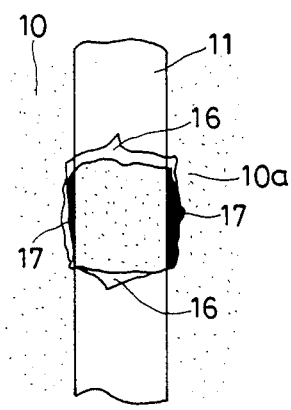
FIG. 3(b) is a plan view showing the influences upon the peripheral portions when the Al wiring is cut by the laser light.
Figure 3C:
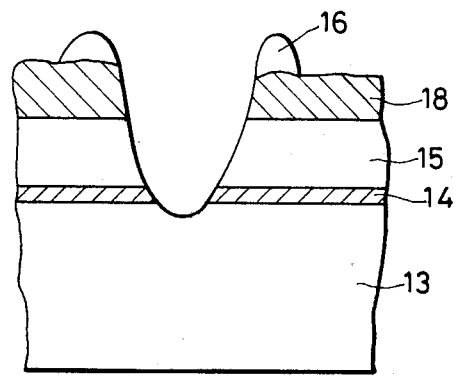
FIG. 3(c) is a sectional view showing the state in which the Al wiring is cut by the laser light.

If the passivation film is formed such as shown in FIG. 4, however, the ion beam does not pass through the passivation film, and the wiring can not be detected by the observation through the SIM. Nonetheless, there is a step portion on the surface of the passivation film because the wiring component protrudes, and this step portion can be observed by the SIM. Accordingly, even if the passivation film is formed, registration to the cut portion can be made by observing the step portion by the SIM.

When the laser technique is employed as in the prior art, the SiO$_2$ or SiN$_4$ film layer is transparent to the light, so that the light passes through the SiO$_2$ insulating layer below the film layer. When the cutting work of the wiring is conducted, the Si substrate having conductivity is also worked, so that short-circuit of the wiring and the Si substrate develops and inspection of the characteristics of the device can not be made. When the wiring is cut by the ion beam as in the embodiment described above, however, the ion beam is opaque to the SiO$_2$ layer below the wiring, and hence the P-type Si substrate below the SiO$_2$ layer is not directly worked. If the ion beam is radiated to this SiO$_2$ insulating layer for a long period, there is the possiblity that the beam reaches the p-type Si substrate. This problem can be solved in the following manner. For instance, a second ion mass spectrometer 111 such as a quadrapole mass spectrometer is disposed inside the specimen chamber 40 besides the SIM 86, and the ion mass measuring apparatus 114 detects the timing $t_1$ at which the signal corresponding to Al is no longer generated and only the signal corresponding to Si is produced, on the basis of the second ion signal obtained from this second ion mass spectrometer 111, and generates a signal to the control system 112 so that the control system stops the radiation of the ion beam.

Figure 13A:
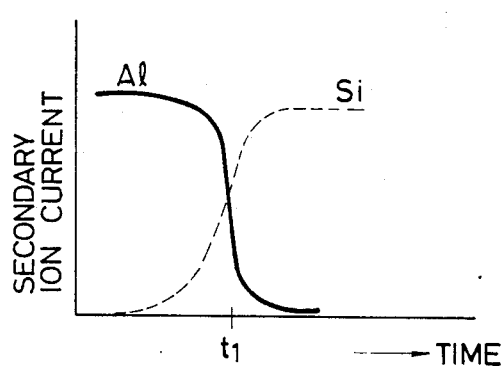
FIG. 13A is a diagram showing the output of a mass spectrometer.
Figure 13B:
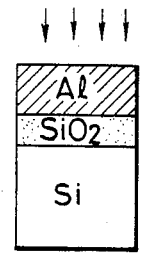
FIG. 13B is a sectional view showing an IC device in the same way as FIG. 2.

FIG. 13A illustrates the output signal of the second ion mass spectrometer 111. In the present invention, the IC device having the thin Al wiring film on the SiO$_2$ insulating layer is worked by ion beam from above, as shown in FIG. 13B. In this case, only Al (represented by solid line) is detected as the second ion current at the beginning as shown in FIG. 13A, and when the work approaches gradually the boundary between the Al wiring layer and the SiO$_2$ insulating layer, Si (represented by dotted line) of SiO$_2$ is detected. This Al is replaced by Si at the boundary and when the work is further continued, Al is no longer detected but only Si is detected. Accordingly, since the ion mass measuring apparatus 114 discriminates this change, it becomes possible to detect the timing t at which the cutting work of the Al wiring reaches the boundary. Thus, the radiation of the ion beam can be stopped by applying the signal at this time to the control system 112.

Since the ion beam is opaque to the SiO$_2$ insulating layer when carrying out the ion beam work, the portion of the SiO$_2$ layer can stop the ion beam work before the work reaches the Si substrate, thereby preventing the short-circuit of the Al wiring with the Si substrate.

In the embodiment described above, the second ion mass spectrometer 111 is shown used for the measurement, but the control of the ion beam work can also be made on the time basis by reducing the voltage applied from the high voltage source 82 and by conducting the work gradually.

Next, another embodiment of the invention, in which the apparatus for the ion beam work is different from one shown in FIG. 6, will be described with reference to FIG. 14.

Figure 14:
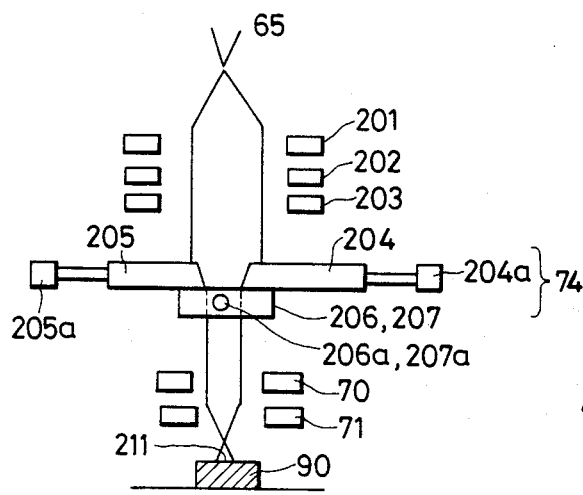
FIG. 14 is a schematic view showing an example of an apparatus for cutting a wiring by an ion beam in accordance with a projection system.

FIG. 14 shows the construction of the apparatus which is constituted by changing the construction of the ion beam optical system of the apparatus shown in FIG. 6 to an aperture projection system. In this case, since the apertures are exposed to the radiation of the ion beam, grounding must be established. If the positions of disposition of the apertures are inside a space of a high voltage, it must be connected to the power output of this voltage. Preferably, the aperture material is selected from those which are difficult to sputter by the ion beam and which have a low sputter ratio, such as Nb, Fe, Ta, W, and the like.

The ion beam emitted from the high luminance ion source 65 is turned into parallel beams by the electrostatic lenses 201, 202 and 203, and are then incident to the apertures 204 through 207. The ion beam image by the apertures is diminished, formed and projected onto the IC device by the electrostatic lenses 70, 71. Here, reference numeral 211 represents the projected image. If the electrostatic lenses 70 and 71 have a magnification of 40×, a rectangular ion beam image of 1μ can be set on the surface of the IC device with an accuracy of ±0.05μ if a 40μ rectangle is set with an accuracy of ±2μ by adjusting the micro-meter heads 204a through 207a. In other words, locating can be easily made with a high level of accuracy and advantageously. In this case, the apertures are set so that the ion beam is radiated to the portion of the rectangle 12 in FIG. 9A, and the radiation of the ion beam is conducted so as to cut the wiring 11. The output of the ion beam must be increased in this case, but the working speed becomes lower.

Figure 15:
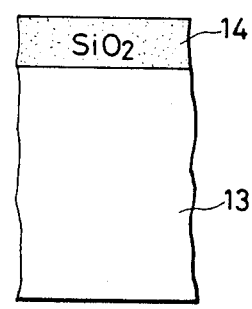
FIGS. 15, 16(a) and 16(b) are sectional views showing the state in which the wiring and the passiviation film are worked by the ion beam work, respectively.

When the wiring of the IC having a section such as shown in FIG. 2 is effected using the ion beam optical system shown in FIGS. 6 and 14, only the Al wiring 15 can be removed with a high level of accuracy but without affecting or damaging the peripheral portion by the ion beam sputtering work, and a section such as shown in FIG. 15 can be obtained.

Figure 16A:
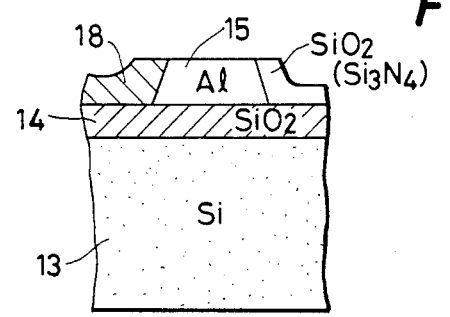
Figure 16B:
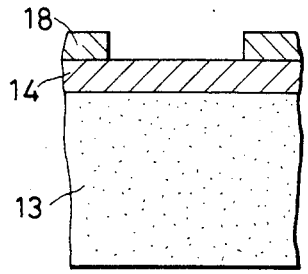

If cutting of the wiring having the passivation coating such as shown in FIG. 4 is effected, the passivation film 18 is first worked till the surface of the Al wiring 15 as shown in FIG. 16(a), because the ion beam work is carried out sequentially from the passivation film on the surface. Next, the Al wiring 15 is worked to provide the section such as shown in FIG. 16(b). In this case, too, the damage of the peripheral portion, the crack of the lower part of the passivation film and the damage of the adjacent portion are not at all observed, unlike the laser work.

Figure 17:
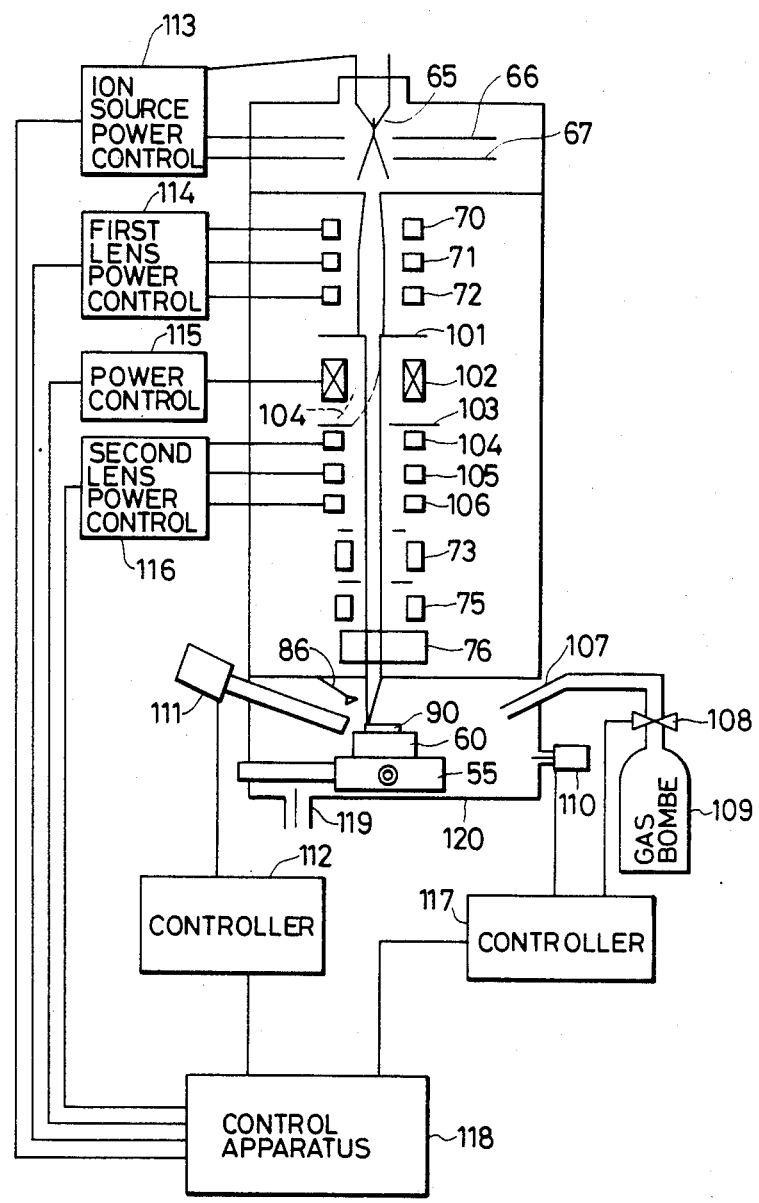
FIG. 17 is a block diagram showing the apparatus for correcting the wiring by means of the ion beam equipped with an alloy ion source and a mass spectrometer.

FIG. 17 is a sectional view showing the principal portions of the apparatus in accordance with still another embodiment of the present invention. In the drawing, the vacuum exhaust system, the second electron image display, the specimen exchange chamber, the table, and the like are omitted, because they are the same as those shown in FIG. 6.

The liquid metal ion source 65 is an alloy ion source such as Al-Si, Au-Si, and so forth. The ion beam which is extracted by the extraction electrode 66 and is controlled by the control electrode 67 is turned into the parallel beams by the apertures 70, 71 and 72, and part of the beam is taken out by the aperture 101. When it passes through the EXB mass filter 102, the electric field E and the magnetic field B to be applied thereto are controlled by the power control 115 of the EXB mass filter 102. Thus, only the ions having a specific mass move straight and pass through the lower aperture 103, while the rest are deflected and kicked off by the aperture 103 such as the beam 104 and can not reach the lower portion. The ions that move straight are converged by the converging lenses 104, 105 and 106, and then reach the IC device 90 through the blanking electrode 73 and the deflection electrodes 75 and 76.

Exhaust of the specimen chamber 120 is effected by the exhaust pump from passage 119. A gas introduction nozzle 107 from a gas bomb 109 of N$_2$ or O$_2$ gas is disposed inside the specimen chamber 120 and the valve of the bomb is controlled by the controller 117. A vacuum meter 110 is also disposed inside the specimen chamber 120 to monitor the vacuum inside the specimen chamber 120, and the controller 117 controls the valve 108 so as to establish a predetermined gas concentration. A secondary ion mass spectrometer 111 such as a quadrapole mass analyzer is disposed in the specimen chamber in addition to the secondary electron detector 86. The system for the mass spectroscopy of the secondary ions, that are generated when the ion beam is radiated to the specimen 90, is controlled by one controller 118, and the output signal of the secondary ion mass spectrometer 111 is applied to the controller 112. Reference numeral 113 represents an ion source controller which controls the current of the heater 65 of the ion source, the voltage of the extraction electrode 66, the voltage of the control electrode 67, and so forth. Reference numeral 81 represents a power source controller of the first lens which controls the first electrostatic lenses 70, 71 and 72. Reference numeral 115 represents a power source controller which controls the power source of the EXB mass filter 102. Reference numeral 116 represents a power source controller of the second lens which controls the power source of the second lenses 104, 105 and 106.

Reference numeral 118 represents a controller which controls all the ion source power controller 113, the power source controller 114 of the first lens, the power source controller 115 of the EXB mass filter and the power source controller 116 of the second lens. Though not shown in the drawing, the power source controller for the blanking electrode 73 and for the deflection electrodes 75 and 76 are also controlled by the controller 118.

The measurement by the secondary ion mass spectrometer is effected in the same way as above. According to the arrangement shown in FIG. 17, the hole of the passivation film can be buried after the passivation film at the upper portion is removed and the Al wiring is then cut, as shown in FIG. 16(a). For example, an Au-Si alloy ion source is employed as the ion source 65, and only the Au ion is taken out by the EXB mass separator 102 to execute the work. After the passivation film and the Al wiring are worked as shown in FIG. 16(b), the electric field as well as the magnetic field to be applied to the EXB mass separator are changed so as to take out only the Si ions. The valve 108 of the gas bomb 109 is opened to introduce the $O_2$ gas into the specimen chamber 102, and after the pressure is measured by the vacuum meter, the controller 117 controls the opening of the valve 108 so that the pressure reaches a predetermined pressure.

The voltages to be applied to the first and second lenses are varied by the power source controllers 114, 116 so that the ion beam is incident to the specimen portion while being converged delicately with an energy of several to several tens of KeV. (When the work is effected, the energy is at least 10 KeV.) With such a low energy, the ion beam is deposited onto the surface of the specimen, generating a deposition.

Figure 18:
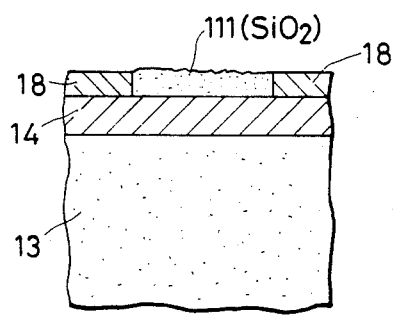
FIG. 18 is a sectional view showing an IC device.

Accordingly, the Si ion beam is radiated to the opening of the passivation film 18 shown in FIG. 16(b) inside the $O_2$ atmosphere, whereby the $SiO_2$ film 111 can be evaporated as shown in FIG. 18.

If $N_2$ is used in place of $O_2$ as the gas to be introduced, an $Si_3N_4$ film can be evaporated. This makes it possible to bury the hole of the passivation film on the cutting portion of the Al wiring and to coat once again the passivation film. Thus, deterioration of the device can be prevented and the electric characteristics of the device can be stabilized. In order to promote the forming reaction of the oxide or nitride film by the Si ions in this instance, it is necessary to heat the IC device by a heater or radiating locally the laser to the IC device.

FIGS. 19(a) through 19(e) show still another embodiment which uses the apparatus shown in FIG. 17. In other words, the embodiment illustrates a method of cutting the Al wiring of a lower layer portion by use of the ion beam at the point of intersection when the upper and lower two layers of Al wirings cross each other.

Figure 19A:
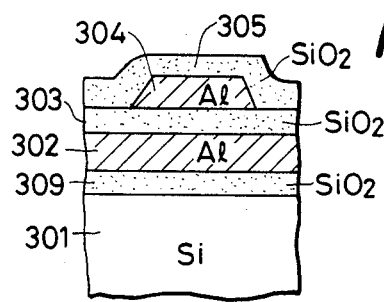
FIGS. 19(a) through 19(e) are sectional views showing a method of cutting a lower wiring.
Figure 19B:
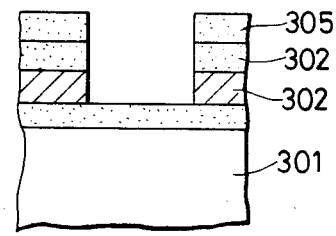
Figure 19C:
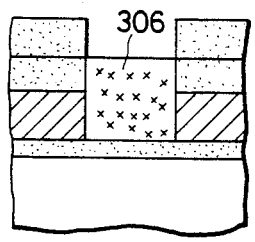
Figure 19D:
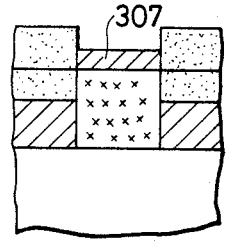
Figure 19E:
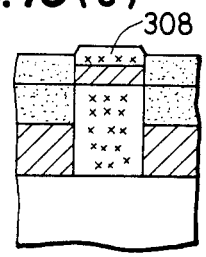

In FIG. 19(a), the Al wiring 302 extends to the right and left on Si 301 via an $SiO_2$ insulating film 309, and the Al wiring 304 extends further thereon via another $SiO_2$ insulating film 303 in the direction perpendicular to the drawing. A passivation film 305 of $SiO_2$ is formed further thereon. The method of cutting only the lower Al wiring 309 will be illustrated below. In the apparatus shown in FIG. 17, the Al-Si alloy ion source is used as the ion source 65, and only the Al ion beam is separated and taken out downwards by the EXB mass separator 102. The Al ion beam is then radiated to the specimen of FIG. 19(a) so as to work till the lower Al wiring, obtaining the section such as shown in FIG. 16(b). Next, the electric field and the magnetic field to be applied to the EXB mass separator 102 are changed so as to take out downwards only the Si ion beam, and the $O_2$ gas is introduced into the specimen chamber 120 from the gas bomb 109. The lens voltage is controlled so that the Si ion beam is radiated to the specimen while being converged at an energy of several KeV. Thereafter, the $SiO_2$ film 306 is evaporated to the height of the lower part of the original upper Al wiring in accordance with the method described in detail above, thereby obtaining the section such as shown in FIG. 19(c). The introduction of the $O_2$ gas is stopped, and the specimen chamber is evacuated to the oxygen-free atmosphere. Only Al is then taken out by the EXB mass separator 102, the Al vacuum deposition layer represented by 307 in FIG. 19(d) is obtained and the original upper Al wiring layer is again formed.

Furthermore, an $SiO_2$ film 308 is evaporated on the upper Al wiring by the same method as described above to form a passivation layer. Thus, only the lower Al wiring can be cut at the point of intersection of the Al wirings.

Figure 20A:
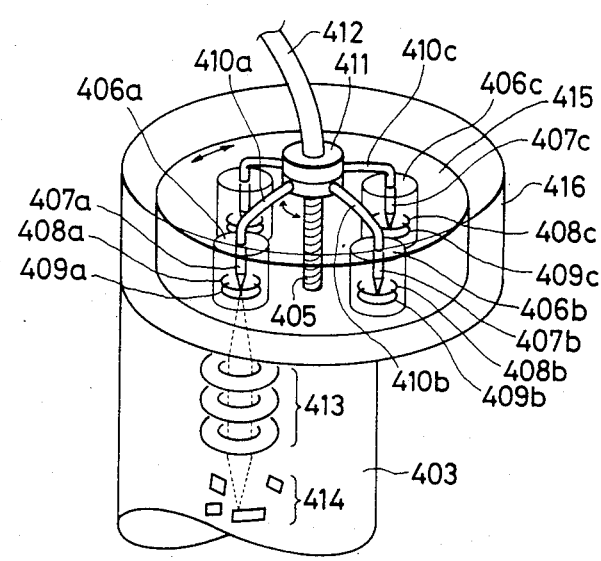
FIG. 20(a) a schematic view showing an apparatus for cutting a wiring by an ion beam, equipped with a large number of ion sources.
Figure 20B:
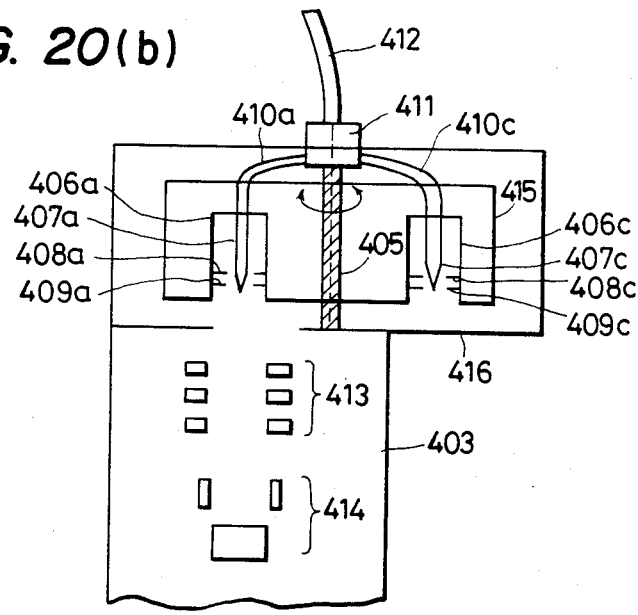
FIG. 20(b) is a sectional view of the apparatus shown in FIG. 20(a).

The embodiment shown in FIG. 17 shows a method which uses an alloy ion source and takes out one kind of metal by use of the EXB mass separator. If a suitable alloy ion source is not available, however, it is necessary to prepare several kinds of ion sources and to change them over. FIG. 10(a) shows an example of such an apparatus, and FIG. 20(b) is its sectional view. In FIG. 20(a), a lens barrel 403 includes elements such as a lens 413, a deflector 414, and so forth. An ion source unit consists of vessels 406a, 406b, 406c, . . . for ion sources of several different kinds of elements, and these vessels are adapted to a cylindrical rotary member 415 and are placed in a vacuum vessel 116 which is connected to the lens barrel. The ion source vessels include ion sources 408a, 408b, 408c, . . . , extraction electrodes 408a, 408b, 408c, . . . , and control electrodes 409a, 409b, 409c, . . . . The heater current, the extraction voltage, the control voltage, and the like are introduced to the respective ion sources by a high voltage cable 412 through branch cables 410a, 410b, 410c via an introduction terminal 411 which serves also as a terminal. In FIG. 20(a), the ion source 407a is shown connected to the optical system and used, but it is possible to use the other ion sources 407b, 407c, . . . by rotating the rotary member 415 with a shaft 405 being the center so as to change over the ion sources. In this apparatus, an angle gauge, a fine adjustment mechanism, a fixing mechanism and the like, not shown, are provided, so that each ion source can be registered to the axis of the optical system with a high level of accuracy.

If the apparatus of this embodiment is employed, the wiring reparing process described above can be executed by a desired combination of arbitrary liquid metal ion sources (or other kinds of ion sources), in addition to the metal ion seeds for forming specific alloys as in the embodiment shown in FIG. 17.

Although the embodiments described above employ the liquid metal ion sources, the present invention can be also applied to other kinds of high luminance ion sources such as an electrolytic dissociation ion source, a micro-discharge type ion sources, and so forth.

Particularly when a wiring is to be cut by an ion beam having high luminance, the work becomes a sputtering work so that the side of the wiring is likely to be worked. To solve this problem, the energy to be applied to the center is increased so as to uniformly cut the wiring.

As described above, the present invention makes it possible to cut a wiring without causing the damage of the device or adversely affecting the device, unlike the conventional laser technique. The present invention makes it also possible to cut a wiring having thereon a passivation coating which has been difficult to work in accordance with the conventional laser technique. In accordance with the present invention, the passivation coating that has once been removed can be coated again.

The present invention can be used for correcting and repairing a delicate wiring of all the kinds of devices such as VLSI, ULSI and the like whose miniaturization is expected to be ever-increasing in future, and provides an extremely large effect in shortening the developing process so as to find out defective portions and to repair them, and in improving the production yield.

What is claimed is:

1. A method of correcting a device comprising:
   extracting an ion beam from an ion source having a high brightness, such as provided by a liquid metal ion source or the like;
   converging said ion beam to a fine spot by means of a charge particle optical system and a plurality of aligned apertures;
   aligning said ion beam and locating a wiring portion formed outside an active layer region of a device by positioning said spot while observing a step surface portion of a passivation film on said wiring portion by means of a scanning ion microscope unit; and
   radiating said ion beam on the passivation film portion on said wiring portion and on said wiring portion itself to remove sequentially said passivation film portion and said wiring portion by a sputtering process without causing damage of said active layer region of the device.

2. The method of correcting a device as defined in claim 1, wherein said ion beam is converged to a fine spot smaller than the wiring width, and said spot is radiated to said wiring portion while avoiding the active layer region of the device and is scanned by a deflection electrode over the surface of said wiring portion.

3. The method of correcting a device as defined in claim 1, wherein said ion beam is neutralized by an electron shower when said ion beam is radiated onto said wiring portion, so as to prevent said wiring portion from being charged electrically.

4. The method of correcting a device as defined in claim 1, wherein the radiation of said ion beam is stopped when an ion mass spectrometer detects that said wiring portion is removed and said ion beam reaches an insulating layer located below said wiring portion.

5. The method of correcting a device as defined in claim 1, wherein a projection image of an aperture having a width substantially in agreement with the width of said wiring portion is formed from said ion beam by said charged particle optical system so as to remove said wiring portion by said projection image.

6. The method of correcting a device as defined in claim 1, wherein said ion beam is radiated onto a specimen having a film of other material on said wiring portion to remove said film of said other material, and said wiring portion is thereafter removed.

7. The method of correcting a device as defined in claim 6, wherein another film exists on said wiring portion, and after both of said wiring portion and said film are worked by said ion beam, a film is deposited thereon using said ion beam.

8. The method of correcting a device as defined in claim 1, wherein a voltage to be applied to said charged particle optical system is varied to carry out the work on a specimen at a voltage above several KV, and deposition is effected on said specimen by said ion beam at a voltage below said several KV.

9. The method of correcting a device as defined in claim 8, wherein a gas is introduced into a specimen portion and a compound between the element of said ion beam and said gas is deposited.

10. The method of correcting a device as defined in claim 1, wherein an ion source providing a plurality of ion species is provided as the ion source, and a beam of selected ion species is extracted by mass separation, and work or deposition is effected using said extracted ion beam.

11. The method of correcting a device as defined in claim 1, wherein a plurality of ion sources having different ion species are provided as the ion source, and are selectively changed over to extract the beam of a desired ion special, and work or deposition is effected using said extracted beam.

12. The method of correcting a device as defined in claim 1, wherein a layer to be removed from a specimen portion, in which said layer to be removed exists at the lower part of a layer consisting of a plurality of kinds of materials, is removed sequentially from the upper portion, and the materials thus removed sequentially are deposited sequentially from the lower part of the upper part.

13. An apparatus for correcting a device comprising:
   a specimen chamber formed inside a vacuum vessel;
   a table for placing a specimen thereon, disposed inside said specimen chamber;
   an ion source having a high brightness, such as provided by a liquid metal ion source, and disposed inside said vacuum vessel so as to oppose said specimen chamber;
   means for extracting an ion beam from said ion source;
   a charged particle optical system for focusing said ion beam thus extracted onto said specimen; and
   means for controlling the output of said ion beam, the spot diameter and the radiating direction of the spot so as to radiate said ion beam onto a wiring portion of a device, including a scanning ion microscope unit for visually observing said specimen during radiation of said ion beam onto said specimen.

14. The apparatus for correcting a device as defined in claim 13, wherein a plurality of apertures having adjustable sizes are disposed between said ion source and said specimen, and the image of said apertures of said ion beam is projected by said charged particle optical system onto said specimen.

15. The apparatus for correcting a device as defined in claim 13, wherein a plurality of said ion sources having different ion species are provided in said vacuum vessel, and including means for selecting one of said ion sources so as to radiate said ion beam of a selected ion species onto said specimen.

16. The apparatus for correcting a device as defined in claim 13, wherein an ion source producing a plurality of ion species is provided as said ion source and a mass separator is disposed at a mid position between said ion source and said specimen so that a specific kind of ion species reaches and bombards said specimen.

17. A method of correcting a device comprising:
extracting an ion beam from an ion source having a brightness such as provided by a liquid metal ion source or the like;
converging said ion beam to a fine spot by means of a charged particle optical system applied at a voltage above several KV and an aperture;
aligning said ion beam and locating a wiring portion outside an active layer region of a device by positioning said spot while observing a step surface portion of a passivation film on said wiring portion by means of a scanning ion microscope unit;
radiating said ion beam onto the passivation film portion on said wiring portion and on said wiring portion itself to remove sequentially said passivation film portion and said wiring portion by a sputtering process without causing damage to a peripheral device or damage to the active layer region of the device; and
depositiing a film on a bore portion produced when the passivation film portion and wiring portion were removed by said ion beam by radiating the ion beam at a voltage below said several KV to said specimen provided in an atmosphere introducing a gas.

18. The method of correcting a device as defined in claim 17,
wherein said film deposited on said bore portion is a compound of the element of said ion beam and said gas.

19. The method of correcting a device as defined in claim 17,
wherein an ion source consisting of a plurality of kinds of elements of different ion species is provided as the ion source, a beam of selected ion species is extracted by means of mass separation, and removal or deposition is performed using said ion beam.

20. The method of correcting a device as defined in claim 17,
wherein a plurality of ion species are produced by the ion source, a beam of a desired ion species is extracted, and removal or deposition is performed using said extracted beam.

21. The method of correcting a device as defined in claim 17,
wherein films consisting of a plurality of kinds of materials are deposited sequentially from the lower part to upper part on said bore portion.

* * * * *

REEXAMINATION CERTIFICATE (1909th)
United States Patent [19]
Yamaguchi et al.

[11] B1 4,609,809
[45] Certificate Issued Jan. 26, 1993

[54] METHOD AND APPARATUS FOR CORRECTING DELICATE WIRING OF IC DEVICE

[75] Inventors: Hiroshi Yamaguchi, Fujisawa; Akira Shimase, Yokohama; Tateoki Miyauchi, Yokoha; Mikio Hongo, Yokohama, all of Japan

[73] Assignee: Hitachi, Ltd., Tokyo, Japan

Reexamination Request:
No. 90/002,655, Feb. 28, 1992

Reexamination Certificate for:
Patent No.: 4,609,809
Issued: Sep. 2, 1986
Appl. No.: 590,344
Filed: Mar. 16, 1984

[30] Foreign Application Priority Data
Mar. 16, 1983 [JP] Japan .................. 58-42126

[51] Int. Cl.⁵ ........................... B23K 15/00
[52] U.S. Cl. .................. 219/121.35; 204/192.34; 219/121.19; 219/121.2; 250/492.2
[58] Field of Search .......... 219/121.19, 121.2, 121.18, 219/121.21, 121.23, 121.26, 121.27, 121.29, 121.3, 121.35, 121.12; 204/192.34; 250/309, 492.2, 492.3

[56] References Cited
U.S. PATENT DOCUMENTS

| | | | |
|---|---|---|---|
| Re. 33,193 | 4/1990 | Yamaguchi et al. | 250/309 |
| 3,162,767 | 12/1964 | DiCurcio et al. | 250/307 |
| 3,517,191 | 6/1970 | Liebl | 250/49.5 |
| 3,699,334 | 10/1972 | Cohen et al. | 204/192.34 |
| 3,881,108 | 4/1975 | Kondo et al. | 250/307 |
| 3,889,115 | 6/1975 | Tamura et al. | 250/307 |
| 4,063,091 | 12/1977 | Gee | 250/310 |
| 4,190,759 | 2/1980 | Hongo et al. | 219/121.68 |
| 4,259,367 | 3/1981 | Dougherty, Jr. | 219/121.2 |
| 4,419,203 | 12/1983 | Harper et al. | 204/192.34 |
| 4,457,803 | 7/1984 | Takigawa | 156/626 |
| 4,503,329 | 3/1985 | Yamaguchi et al. | 250/309 |

FOREIGN PATENT DOCUMENTS

| | | |
|---|---|---|
| 49-38295 | 4/1974 | Japan . |
| 49-67575 | 7/1974 | Japan . |
| 55-50652 | 4/1980 | Japan . |
| 55-150225 | 11/1980 | Japan . |
| 56-80131 | 1/1981 | Japan . |
| 56-94630 | 7/1981 | Japan . |
| 56-111227 | 9/1981 | Japan . |
| 57-87124 | 5/1982 | Japan . |
| 58-2022 | 1/1983 | Japan . |
| 58-56332 | 4/1983 | Japan . |

OTHER PUBLICATIONS

"Microprobe for the Ion Bombard Mass Analyzer", Tamura et al, University Park Press, Tokyo, 1970, pp. 205-209.
"Focused Ion Beam in Microfabrication", Seliger, J. Appl. Phys., vol. 45, No. 3, 1974, pp. 1415-1422.
"A High Intensity Scanning Ion Probe with Submicrometer Spot Size", Seliger, App. Phys. Lett. 34(5), 1979, pp. 310-312.
"Liquid Metal Field-Emission Ion Sources and Their Applications", Inst. Phys. Conf. Ser. No. 54, Chap. 7 (1980), pp. 316-320.
"Scanning Microbeam Using A Liquid Metal Ion Source", J. Vac. Sci Technol. 20(1), Jan. 1982, pp. 80-83.
"The Focused Ion Beam Exposure Apparatus Employing Liquid Metal Ion Source", Ion Implantation and Sub-Micron Machinery, No. 13, Symposium Inst. of Physical and Chemical Research, 1982, pp. 19-22, (Translation pp. 1-10).

*Primary Examiner*—Philip H. Leung

[57] ABSTRACT

The invention discloses a method and apparatus for correcting a device characterized in that an ion beam is extracted from an ion source having high luminance such as a liquid metal ion source or the like, the ion beam is then converged to a delicate spot by use of a charged particle optical system and apertures, a wiring portion formed on and outside of an active layer region of a device and connected to the device is located to the spot by observing the wiring portion through an SIM, the ion beam in neutralized by an electron shower so as to prevent the wiring portion from being charged electrically, the converged ion beam spot is radiated to the wiring portion to remove the wiring portion, and radiation of the ion beam is stopped while observing the ion beam by a second ion mass spectrometer which detects that the wiring portion is cut by the ion beam and the ion beam reaches an insulating layer.

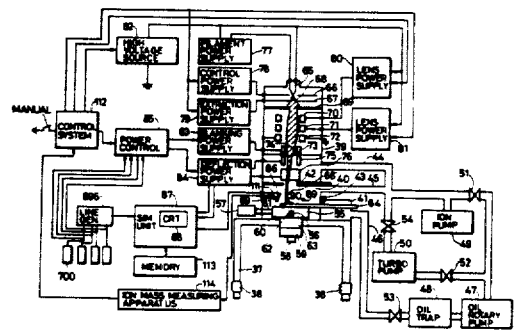

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-21 is confirmed.

New claims 22-24 are added and determined to be patentable.

*22. The apparatus for correcting a device as defined in claim 13, wherein said controlling means includes spot diameter control means for controlling said spot diameter of said ion beam radiated onto said specimen so that said spot diameter is less than 0.3 μm which is smaller than a width of said wiring portion.*

*23. The apparatus for correcting a device as defined in claim 13, wherein said scanning ion microscope unit includes monitor means providing a display for visually observing said specimen, and said controlling means controls the radiating direction of said ion beam in accordance with a range of positions as displayed on said monitor means so as to enable sputter processing of said wiring portion of said device.*

*24. The apparatus for correcting a device as defined in claim 13, wherein said means for controlling includes spot radiating direction control means for controlling the radiating direction of said ion beam so as to radiate said ion beam onto a passivation film portion on said wiring portion and onto said wiring portion itself, said scanning ion microscope unit enabling visual observation of a surface portion of said passivation film portion during radiation of said ion beam onto the surface portion of said passivation film portion on said wiring portion.*